United States Patent [19]

Morishita et al.

[11] 4,239,558
[45] Dec. 16, 1980

[54] METHOD OF MANUFACTURING SEMICONDUCTOR DEVICES UTILIZING EPITAXIAL DEPOSITION AND TRIPLE DIFFUSION

[75] Inventors: Mitsuharu Morishita; Shiroh Iwatani, both of Himeji, Japan

[73] Assignee: Mitsubishi Denki Kabushiki Kaisha, Himeji, Japan

[21] Appl. No.: 43,873

[22] Filed: May 30, 1979

[30] Foreign Application Priority Data

Jun. 1, 1978 [JP] Japan ............................... 53-66869
Jul. 3, 1978 [JP] Japan ............................... 53-81159

[51] Int. Cl.³ .................... H01L 21/20; H01L 21/22
[52] U.S. Cl. ............................. 148/175; 29/576 W; 29/578; 148/187; 148/190; 357/34; 357/44; 357/46; 357/48; 357/89; 357/90
[58] Field of Search ............... 148/175, 187, 190; 29/576 W, 577, 578; 357/34, 44, 46, 48, 89, 90

[56] References Cited

U.S. PATENT DOCUMENTS

| | | | |
|---|---|---|---|
| 3,309,537 | 3/1967 | Archer | 357/44 X |
| 3,391,035 | 7/1968 | Mackintosh | 148/187 |
| 3,453,505 | 7/1969 | Offner et al. | 357/44 |
| 3,518,494 | 6/1970 | James | 357/48 X |
| 3,596,115 | 7/1971 | Conzelmann | 357/44 X |
| 3,981,072 | 9/1976 | Buie | 148/187 X |
| 3,982,269 | 9/1976 | Torreno et al. | 357/89 X |
| 4,038,680 | 7/1977 | Yagi et al. | 357/44 |
| 4,047,220 | 9/1977 | Ferro et al. | 357/89 X |

Primary Examiner—L. Dewayne Rutledge
Assistant Examiner—W. G. Saba
Attorney, Agent, or Firm—Sughrue, Rothwell, Mion, Zinn and Macpeak

[57] ABSTRACT

A method of manufacturing a semiconductor device having at least one power transistor and a plurality of small signal transistors formed on the same semiconductor substrate is disclosed. First, a base region of the power transistor and an isolating region are formed by diffusion simultaneously in an epitaxial layer on the semiconductor substrate. Second, an emitter region of the power transistor and the collector regions of the small signal transistors are simultaneously formed by diffusion, and finally the bases, and emitters of the small signal transistors are formed in succession by diffusion.

9 Claims, 3 Drawing Figures

METHOD OF MANUFACTURING SEMICONDUCTOR DEVICES UTILIZING EPITAXIAL DEPOSITION AND TRIPLE DIFFUSION

BACKGROUND OF THE INVENTION

This invention relates to a method of manufacturing an integrated semiconductor device in which at least one transistor for high power (hereinafter referred to as "a power transistor" when applicable) and a plurality of transistors for small signals (hereinafter referred to as "small signal transistors" when applicable) are formed on the same semiconductor substrate.

To appreciate a full understanding of the merits of this invention, first a conventional method of manufacturing an integrated semiconductor device will be described with reference to FIG. 1 which shows the structure of a conventional semiconductor device having three NPN transistors formed on a P+ type semiconductor substrate.

N+ type floating collector regions 2 are first formed in discrete regions of a P+ type semiconductor substrate 1 by selective diffusion. Then, an N− type layer is formed thereon by epitaxial growth.

Thereafter, in order to isolate transistors from one another, P+ type isolating regions 4 are formed so that each of regions 4 contacts with the surface of the P+ type semiconductor substrate 1. Next, N+ type collector-walls 5 contacting the floating collector regions 2 are respectively formed by diffusion. Thereafter P+ type base regions 6 and N+ type emitter region 7 are formed in succession by diffusion in the N− type epitaxial collector regions 3. Finally, collector electrodes 9, base electrodes 10, emitter electrodes 11, and ground electrode 12 of the P+ type semiconductor substrate are suitably formed.

This prior art structure is disclosed by Davis, in "Bipolar Design Considerations for the Automotive Environment" pp. 419–427 of IEEE Journal of solid-state circuits, vol. SC-8. No. 6, December 1973. As discussed therein, the so-called "Parasitic lateral n-p-n transistor" is formed as shown in FIG. 7 of that article. In such a device a serious problem exists with negative voltage transients applied to the N− epitaxial layer that forward bias the N/P substrate and junction to inject electrons into the substrate. Given these structural difficulties, the prior art recognizes the practice of connecting the N− epi islands to a positive supply terminal for suitable biasing. This technique and others disclosed in the article are employed to prevent parasitic collection of substrate injected electrons.

Also, with the conventional semiconductor device having the above-described structure, it is however impossible to make the N− type epitaxial collector region 3 sufficiently thick. Therefore, it is difficult to provide transistors having high breakdown voltage by this conventional method. Since the collectors are provided in the upper surface of the substrate by means of the N+ type collector-walls 5, the effective areas of the collectors are reduced. Thus, it is also difficult to provide transistors capable of handling a large electric current by this conventional method.

SUMMARY OF THE INVENTION

An object of this invention is to provide a method of manufacturing an integrated semiconductor device in which all of the above-described drawbacks accompanying the conventional integrated semiconductor device manufacturing method have been eliminated.

It is another object of this invention to provide a method of manufacturing an integrated semiconductor device having at least one power transistor having high breakdown voltage and a plurality of transistors for small signals formed on the same semiconductor substrate.

The specific feature of the method of manufacturing an integrated semiconductor device according to the invention resides in the steps of preparing a highly doped semiconductor substrate of one conductivity type and providing a semiconductor layer of the same conductivity type on the surface of said substrate by epitaxial growth. The semiconductor layer has a high specific resistance. First and second highly doped semiconductor regions of the opposite or other type conductivity are formed simultaneously in said layer by diffusion into the surface of said layer. A highly doped, third semiconductor region of the one conductivity type in the first highly doped semiconductor region of the other conductivity type is formed by diffusion. Simultaneously, a plurality of highly doped, fourth semiconductor regions of the one conductivity type are formed in the second semiconductor region, by diffusion. A highly doped, fifth semiconductor region of the other conductivity type in each of said fourth semiconductor regions is formed by diffusion. Next, a highly doped, sixth semiconductor region of the one conductivity type is formed in each of the fifth semiconductor regions, simultaneously by diffusion, and finally electrodes are provided on the substrate, the first region, second region, third region, fourth regions, fifth regions and sixth regions, respectively.

The novel features which are considered characteristic of this invention are set forth in the appended claims. This invention itself, however, as well as other objects and advantages thereof will be best understood by reference to the following detailed description of illustrative embodiments, when read in conjunction with the accompanying drawings.

DETAILED DESCRIPTION OF THE INVENTION

This invention will be described with reference to its preferred embodiments.

Figure 1:
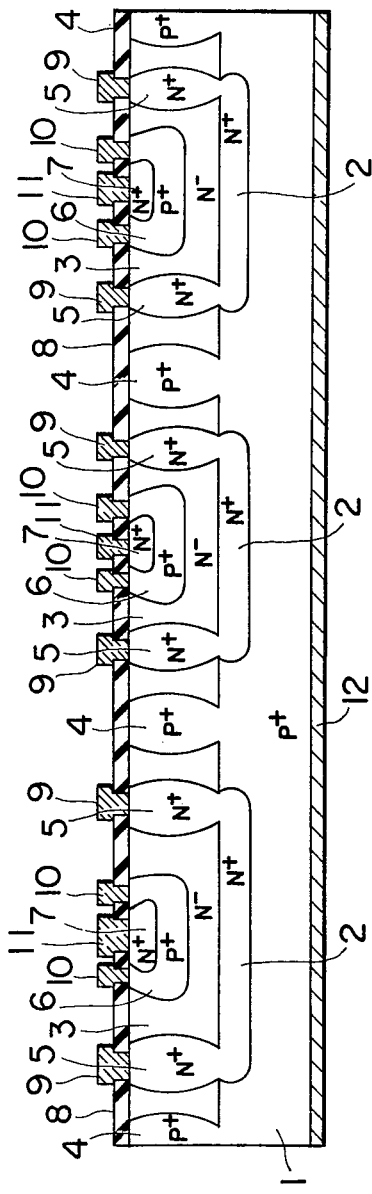
FIG. 1 is a sectional view showing the structure of a conventional integrated semiconductor device.
Figure 2:
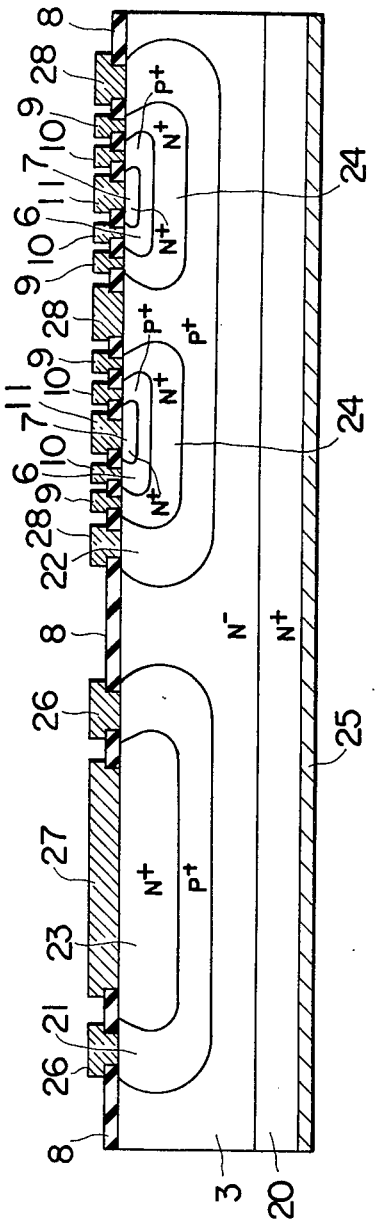
FIG. 2 is a sectional view showing the structure of one example of an integrated semiconductor device according to this invention.

FIG. 2 shows the structure of one example of an integrated semiconductor device according to the invention, in which an NPN power transistor and two NPN transistors for small signals are formed on a semiconductor substrate having an N+ type layer and an N− type layer provided thereon by epitaxial growth.

The integrated semiconductor device in FIG. 2 is manufactured as follows:

First, an N− type layer 3 is formed on an entire surface of an N+ type semiconductor substrate 20 by epitaxial growth. Next, both a P+ type base region 21 for the power transistor and a P+ type region 22 for transistors for small signals are simultaneously formed in the N− type layer 3 by diffusion, which is used to isolate the signal transistors from each other. Then, an N+ type emitter region 23 for the power transistor and N+ type collector regions 24 for the small signal transistors are simultaneously formed in the P+ region 21 and the P+ region 22 by diffusion, respectively. Thereafter, P+ base region 6 of the small signal transistors are formed in the N+ type regions 24, respectively, and, then, N+ type emitter regions 7 are formed in the P+ type regions 6, respectively, with using diffusion techniques. Finally, a collector electrode 25, a base electrode 26 and an emitter electrode 27 for the high power transistor are formed. Electrodes 28 on the P+ type isolating region 22, collector electrodes 9, base electrodes 10 and emitter electrodes 11 for the small signal transistors are suitably formed, the separation between the electrode being provided by insulating layer 8.

Thus, in the integrated semiconductor device according to the invention, the high power transistor section is separated from the small signal transistor section by the N− region 3. The P+ region 22 isolating the small signal transistors and the P+ type base region 21 of the high power transistor are formed simultaneously and the N+ type collector regions 24 of the small signal transistors and the N+ type emitter region 23 of the high power transistor are formed simultaneously. Since the N− type layer 3 can be made sufficiently thick and the N+ type semiconductor substrate 20 is used as the collector for the power transistor, the area of the collector can be made sufficiently large. Hence, it is possible to provide a transistor having a high withstand voltage as well as a plurality of transistors for small signal can be formed on one and the same semiconductor substrate.

Although, in the above described semiconductor device the N− type layer is provided on the N+ type substrate by epitaxy, it may be possible to form the N− type layer by diffusion.

In the above described integrated semiconductor device, the N− type layer 3 is obtained by epitaxially growing it on the N+ type semiconductor substrate 20 and NPN transistors are formed. However, this method is equally applied to provide an integrated semiconductor device with PNP transistors.

Figure 3:
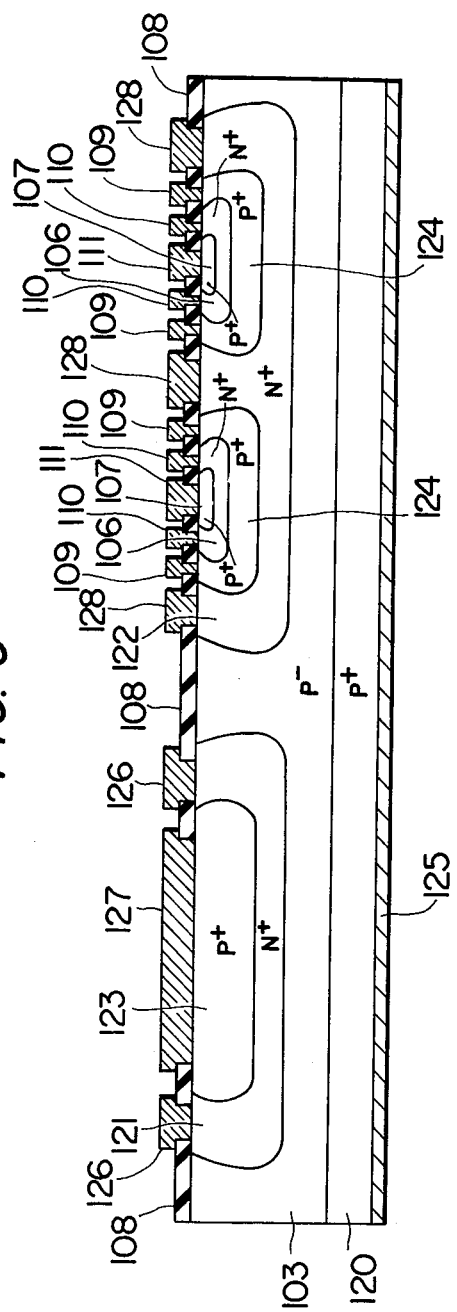
FIG. 3 is also a sectional view showing the structure of another example of the integrated semiconductor device according to the invention.

One example of such an integrated semiconductor device is shown in FIG. 3, which includes one high power PNP transistor and two small signal PNP transistors.

Referring to FIG. 3, reference numeral 120 designates a P+ type semiconductor substrate on which a P− type layer 103 is formed by epitaxial growth. An N+ type base region 121 of the high power transistor and an N+ type region 122 isolating the small signal transistor an formed simultaneously in the P− type epitaxial layer 103 by diffusion. Then, a P+ type emitter region 123 for the high power transistor and P+ type collector regions 124 for the small signal transistor are formed simultaneously in the N+ type regions 121 and 122 respectively by diffusion. Thereafter N+ type base region 106 for the small signal transistors are formed simultaneously in the P+ regions 124, respectively. P+ type emitter regions 107 for each small signal transistors are then formed by diffusion. On the structure thus formed, an oxide film 108 is provided and etched suitably to provide electrode areas on which electrodes 109, 110, 111 and 128 as collector base, emitter and power electrodes for the small signal transistors and electrodes 126 and 127 as a base and an emitter electrode for the power transistor are formed, respectively. A collector electrode of the power electrode 125 is formed on the surface of the substrate 120.

In the integrated semiconductor device thus constructed, the collector region 120 for the power transistor is the P+ layer. Therefore, the collector resistance thereof is advantageously reduced.

As is apparent from the above description, at least one high power transistor having high withstand voltage and a plurality of small signal transistors can be readily formed on the same semiconductor substrate. Furthermore, the breakdown voltage of the portion for separating the high power transistor section from the small signal transistor section is compatible to the reverse breakdown voltage of the high power transistor section which is considerably high. In addition, the integrated semiconductor device according to the invention can be manufactured in accordance with the conventional manufacturing techniques making mass production thereof very easy.

As described herein, the integrated semiconductor device according to the invention has both a high power transistor and small signal transistors. The small signal transistors are most suitable for a circuit in which a high reverse breakdown voltage is not required.

It is apparent that other modifications may be made without departing from the essential aspects of this invention.

What is claimed is:

1. A method of manufacturing a semiconductor device having at least one power transistor and a plurality of transistors for small signals formed on one semiconductor substrate, comprising the steps of:
preparing a highly doped semiconductor substrate of one conductivity type,
providing a semiconductor layer of said one conductivity type on an entire surface of said substrate, said semiconductor layer having a high specific resistance,
simultaneously providing at least a first and a second highly doped semiconductor regions of the other conductivity type in and around the surface portion of said semiconductor layer, said first region serving as a base region for said power transistor and said second region forming separation regions for said plurality of transistors for small signals,
providing a highly doped, third semiconductor region of said one conductivity type in said first highly doped semiconductor region of said other conductivity type and simultaneously providing a plurality of highly doped, fourth semiconductor regions of said one conductivity type in said second semiconductor region,
providing a highly doped, fifth semiconductor regions of said other conductivity type in each of said fourth semiconductor regions simultaneously,
simultaneously providing a highly doped, sixth semiconductor regions of said one conductivity type in each of said fifth semiconductor regions, and
providing electrodes on said substrate, said first region, said third region, said fourth regions, said fifth regions and said sixth regions, respectively.

2. A method of manufacturing a semiconductor device in claim 1, wherein said one conductivity type is N type and said other conductivity type is P type.

3. A method of manufacturing a semiconductor device in claim 1, wherein said one conductivity type is P type and said other conductivity type is N type.

4. A method of manufacturing a semiconductor device as in claim 1 wherein said semiconductor layer is provided on the surface of said substrate by epitaxial growth.

5. A method of manufacturing a semiconductor device as in claim 1 wherein said first, second, third, fourth, fifth and sixth regions are formed by diffusion.

6. A method of manufacturing a semiconductor device as in claim 1 wherein said first region and said third region define base and emitter regions respectively for said power transistor.

7. A method of manufacturing a semiconductor device as in claims 1 or 6 wherein said fourth region, said fifth regions and said sixth regions define, collector and base, and emitter regions respectively for said small signal transistors.

8. A method of manufacturing a semiconductor device as in claim 1 further comprising the step of providing an oxide film and etching said film to provide areas for said electrodes.

9. A method of manufacturing a semiconductor device as in claim 1 further comprising the step of providing an electrode in said second region.

* * * * *